United States Patent
Warnes (10) Patent No.: US 11,750,187 B2
(45) Date of Patent: Sep. 5, 2023

(54) POWER SUPPLY OUTPUT DEVICE (71) Applicant: Murata Manufacturing Co., Ltd., Nagaokakyo (JP)

(72) Inventor: Frank Warnes, Milton Keynes (GB)

(73) Assignee: MURATA MANUFACTURING CO., LTD., Kyoto (JP)

( * ) Notice: Subject to any disclaimer, the term of this patent is extended or adjusted under 35 U.S.C. 154(b) by 88 days.

(21) Appl. No.: 17/585,016

(22) Filed: Jan. 26, 2022

(65) Prior Publication Data
US 2022/0149835 A1 May 12, 2022

Related U.S. Application Data (63) Continuation of application No. PCT/GB2020/051771, filed on Jul. 23, 2020.

(30) Foreign Application Priority Data

Jul. 31, 2019 (GB) ...................... 1910929

(51) Int. Cl.
*H02M 1/08* (2006.01)
*H02M 3/155* (2006.01)
*H03K 17/567* (2006.01)

(52) U.S. Cl.
CPC ............ *H03K 17/567* (2013.01); *H02M 1/08* (2013.01); *H02M 3/155* (2013.01)

(58) Field of Classification Search
CPC ....... H02M 1/08; H02M 3/155; H03K 17/567
USPC .................................................. 327/108, 109
See application file for complete search history.

(56) References Cited

U.S. PATENT DOCUMENTS

| | | | | |
|---|---|---|---|---|
| 6,191,956 B1 * | 2/2001 | Foreman | ............... | H02M 3/338 363/19 |
| 9,071,245 B2 | 6/2015 | Rozman et al. | | |
| 9,209,793 B2 | 12/2015 | Lee et al. | | |
| 2012/0242376 A1 * | 9/2012 | Ose | ................... | H03K 17/0828 327/109 |
| 2021/0373589 A1 * | 12/2021 | Shi | ......................... | G05F 1/595 |
| 2022/0069818 A1 * | 3/2022 | Qin | ................... | H03K 17/0822 |
| 2022/0149735 A1 * | 5/2022 | Warnes | ................ | H02M 3/158 |

FOREIGN PATENT DOCUMENTS

| | | |
|---|---|---|
| EP | 2 797 233 A2 | 10/2014 |
| WO | 2019/030516 A1 | 2/2019 |

OTHER PUBLICATIONS

Official Communication issued in International Patent Application No. PCT/GB2020/051771, dated Oct. 12, 2020.

* cited by examiner

*Primary Examiner* — William Hernandez
(74) *Attorney, Agent, or Firm* — KEATING & BENNETT, LLP (57) ABSTRACT

A power supply output device converts an input from a DC-DC converter into a bipolar voltage output that is supplied to a gate driver circuit driving a power switch. The power output supply device includes a clamping circuit that sets the voltage values of the bipolar voltage output at a predetermined voltage through switching of one or more switching elements. The power supply output device allows shunting of a high current on the negative side so that the required bipolar voltage output is reached very rapidly.

25 Claims, 8 Drawing Sheets

POWER SUPPLY OUTPUT DEVICE

CROSS REFERENCE TO RELATED APPLICATIONS

This application claims the benefit of priority to GB Patent Application No. 1910929.7 filed on Jul. 31, 2019 and is a Continuation Application of PCT Application No. PCT/GB2020/051771 filed on Jul. 23, 2020. The entire contents of each application are hereby incorporated herein by reference.

BACKGROUND OF THE INVENTION

1. Field of the Invention

This application relates to power supply output devices, and in particular to power supply output devices that can be used with bipolar gate drive applications.

2. Description of the Related Art

The gate drive voltage requirements of power switches, including but not limited to Insulated-gate bipolar transistors (IGBT), Silicon Carbide MOSFETs (SIC) and standard Silicon MOSFETs (MOS), are varied and numerous, especially with the newer emerging technologies such as SIC and Gallium Nitride (GaN) technologies. Increasingly, in fields with power switch gate drive applications, such as those in motor drives, inverters, uninterruptible power sources (UPS), solar power, electric vehicles and so on, an accurate positive and negative (bipolar) voltage is required of a supply voltage, typically 9 V, 12 V, or 25 V.

Figure 1:
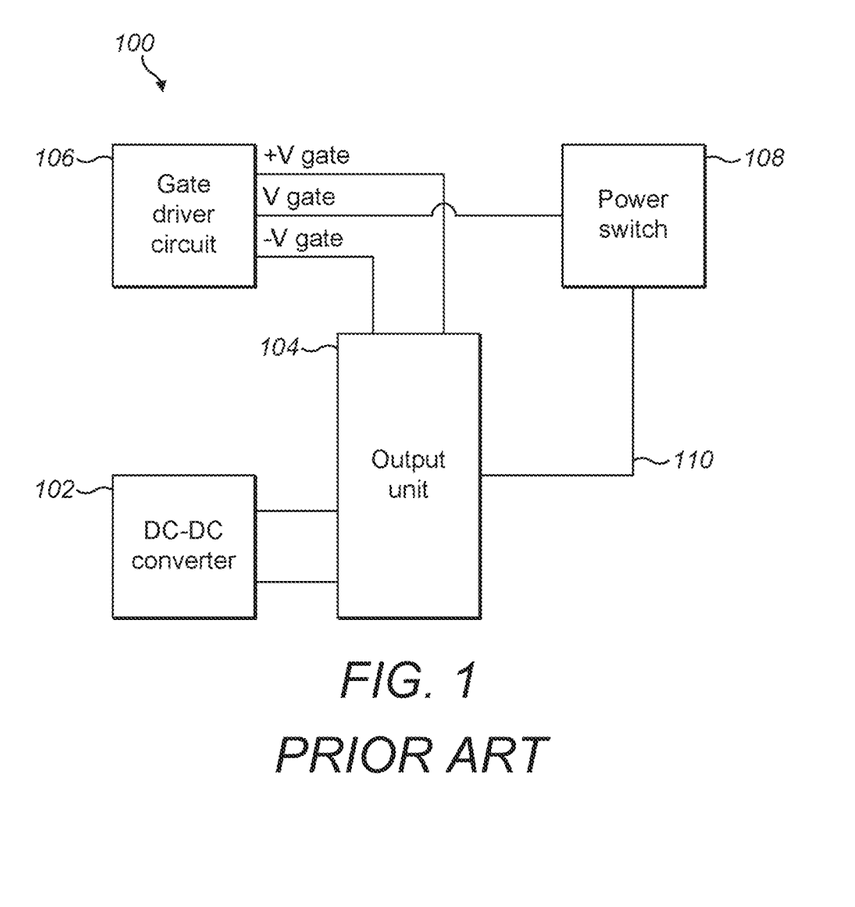
FIG. 1 shows a known configuration of a gate drive system.

FIG. 1 shows a typical configuration of a gate drive system 100 that drives the gate terminal of a power switch. In FIG. 1, a DC-DC converter 102 provides a voltage supply to an output circuitry 104. The output circuitry 104 could be a built-in component of the DC-DC converter 102, or could be a separate unit. The output circuitry 104 outputs a bipolar voltage, including voltages +V gate and −V gate, to a gate driver circuit 106. The gate driver circuit 106 outputs a signal V gate to drive the gate terminal of a power switch 108. The power switch 108 may be an IGBT, SIC, MOS, GaN, or the like. The power switch 108 is connected by an output return line 110 to the output circuitry 104.

Figure 2:
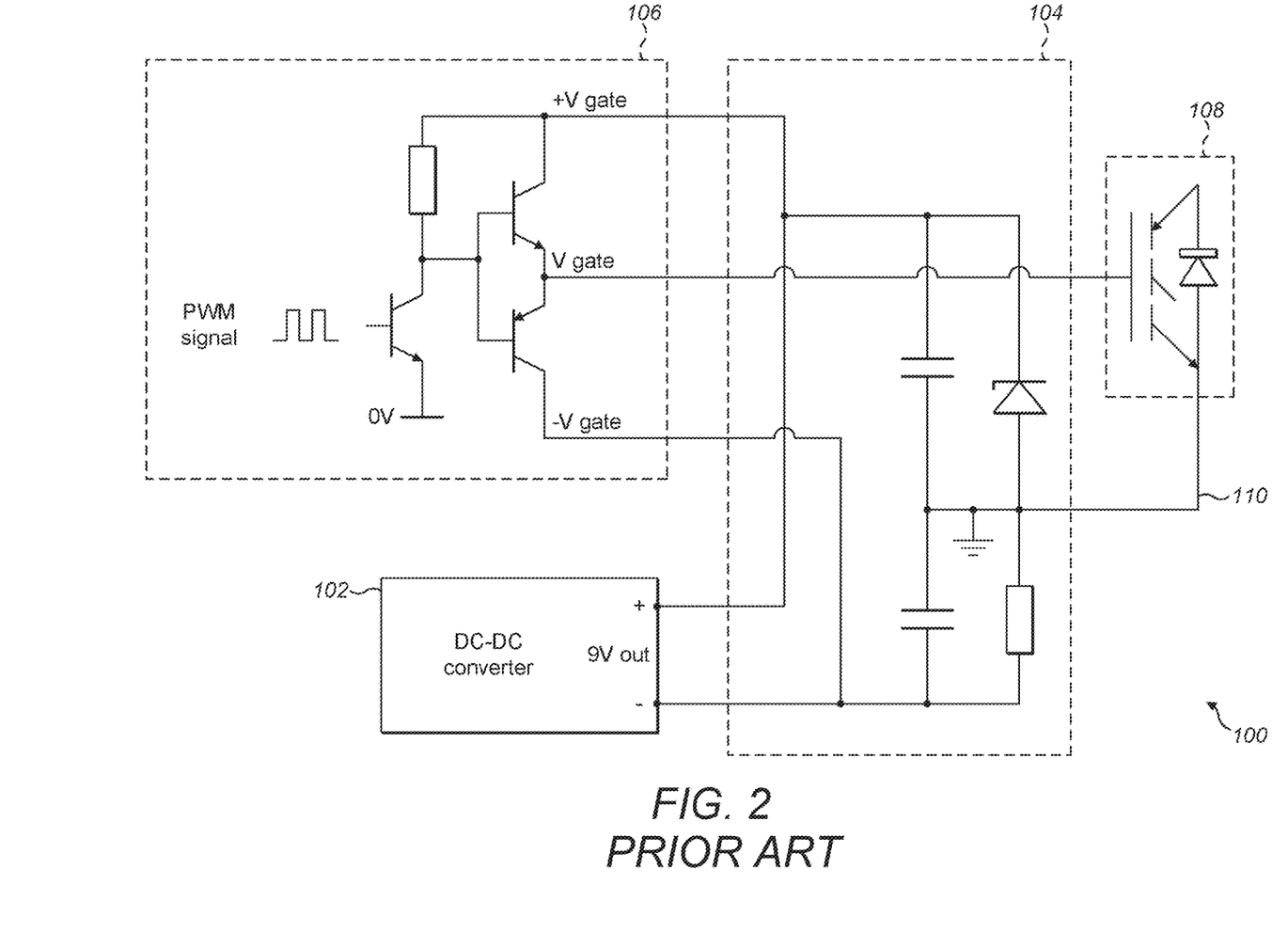
FIG. 2 shows a known configuration of a gate drive system.

FIG. 2 shows the configuration of the gate drive system 100 of FIG. 1 in more detail. In the gate drive system 100 of FIG. 2, the DC-DC converter 102 supplies a voltage to the output circuitry 104. This voltage supplied from the DC-DC converter 102 is an isolated voltage. The exact topology is not important. It could be a push pull, flyback, or forward converter, for example. In FIG. 2, the DC-DC converter 102 supplies a voltage of 9 V as an example. Example circuitry of the output circuitry 104 is shown in FIG. 2, and will be discussed further in FIGS. 3A and 3B. The output circuitry outputs a bipolar voltage including voltages +V gate and −V gate to the gate driver circuit 106. The voltages +V gate and −V gate of the bipolar voltage are not necessarily equal in magnitude. The voltages +V gate and −V gate of the bipolar voltage may, for example, be +6 V and −3 V respectively, with respect to the output return line 110. The gate driver circuit 106 outputs to the gate terminal of a power switch 108 a signal V gate alternating between the voltages +V gate and −V gate as a Pulse Width Modulation (PWM) signal. An example of a possible circuit for the gate driver circuit 106 is shown. An IGBT is shown in FIG. 2 as an example of the power switch 108. The source or emitter terminal of the power switch 108 is connected to the output circuitry 104, via the output return line 110. If the output circuitry 104 is a built-in component of the DC-DC converter 102, the DC-DC converter 102 includes a connection point of the output return line 110, as well as two connection points of the gate driver circuit 106 to connect to the output voltages +V gate and −V gate.

A simple and inexpensive way to provide the voltages +V gate and −V gate is to use an output circuitry 104 including a resistor and Zener diode in series, each with a parallel capacitor. Such an output circuitry 104 is shown in FIG. 3A, and an alternative is shown in FIG. 3B.

Figure 3A:
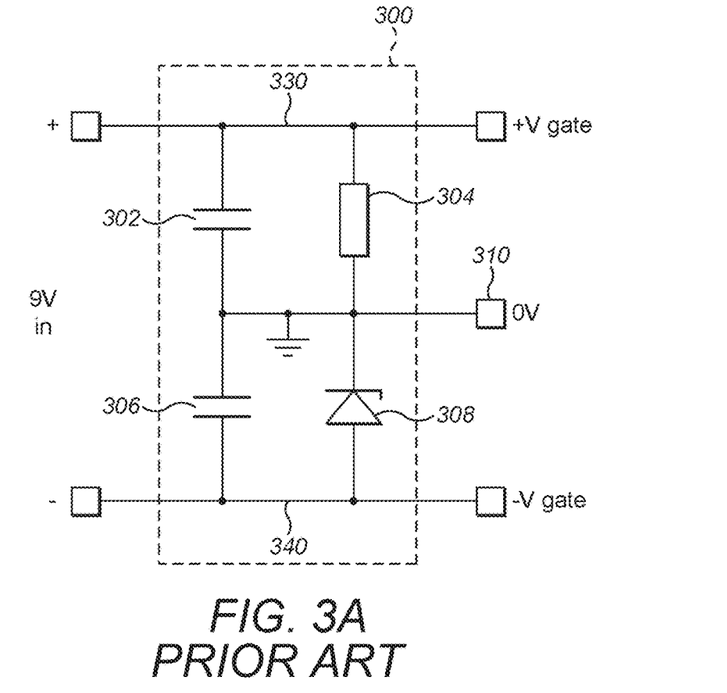
FIG. 3A shows known output circuitry.

FIG. 3A shows an output circuitry 300 of the prior art. The output circuitry 300 includes a first capacitor 302 in parallel with a resistor 304, and in series with a second capacitor 306. The second capacitor 306 is in parallel with a Zener diode 308. The first capacitor 302 and the resistor 304 are connected to an upper power rail 330, and the second capacitor 306 and the anode of the Zener diode 308 are connected to a lower power rail 340. The center divider point 310 is positioned between the resistor 304 and the cathode of the Zener diode 308, and is connected to ground in this example shown in FIG. 3A. When the output circuitry 300 is used in the gate drive system 100 of FIG. 2, the output return line 110 is connected to the center divider point 310 of the output circuitry 300, the voltage supplied by the DC-DC converter is supplied between the upper and lower power rails 330, 340, and the gate driver circuit is connected to the upper and lower power rails 330, 340.

Figure 3B:
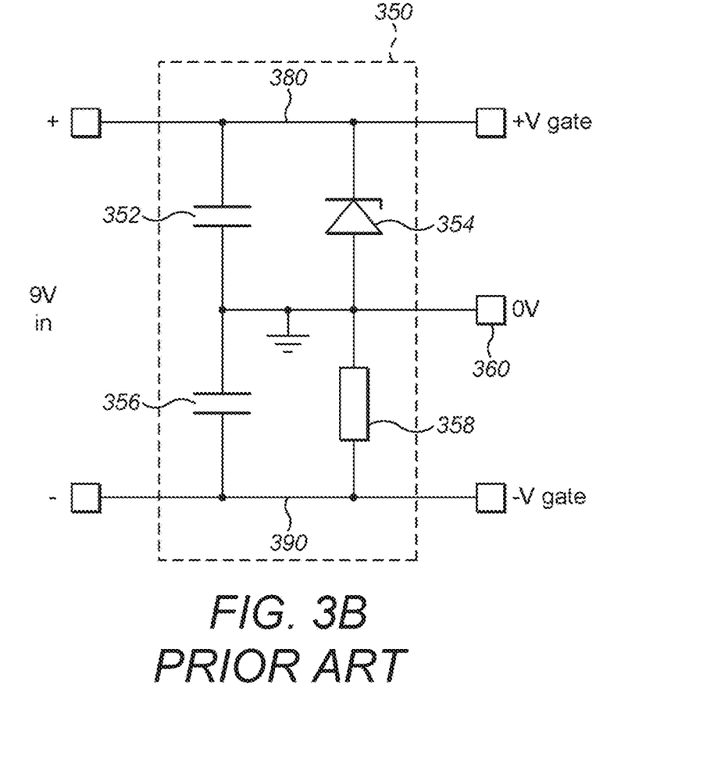
FIG. 3B shows known output circuitry.

FIG. 3B shows a different configuration of an output circuitry 350 of the prior art. The output circuitry 350 includes a first capacitor 352 in parallel with a Zener diode 354, and in series with a second capacitor 356. The second capacitor 356 is in parallel with a resistor 358. The first capacitor 352 and the cathode of the Zener diode 354 are connected to an upper power rail 380, and the second capacitor 356 and the resistor 358 are connected to a lower power rail 390. The center divider point 360 is positioned between the anode of the Zener diode 354 and the resistor 358, and is connected to ground in this example. When the output circuitry 350 is used in the gate drive system 100 of FIG. 2, the output return line 110 is connected to the center divider point 360 of the output circuitry 350, the voltage supplied by the DC-DC converter is supplied between the upper and lower power rails 380, 390, and the gate driver circuit is connected to the upper and lower power rails 380, 390.

In most applications, the capacitors are equal in capacitance so that, when using the output circuitries 300, 350 in the gate drive system of FIG. 2, the voltage across each capacitor will be half the supply voltage at start up. The resistor and Zener diode will then shunt current from one capacitor to the other in order to set the required gate voltages +V gate and −V gate at the respective +V gate and −V gate terminals. Each of the circuits of FIGS. 3A and 3B has a different advantage.

The output circuitry 300 of FIG. 3A has the Zener diode 308 connected between the lower power rail 340 and the output return line 310. In the output circuitry 300 of FIG. 3A after start-up, the second capacitor 306 discharges rapidly through the Zener diode 308, as the Zener diode 308 is above its breakdown voltage. This causes the voltage across the second capacitor 306 to decrease, therefore increasing the voltage across the first capacitor 302. When the voltage across the second capacitor 306 becomes equal to the Zener breakdown voltage of the Zener diode 308, the circuit is balanced with the voltage −V gate clamped at the Zener breakdown voltage.

In most gate drive applications, the positive voltage +V gate is larger than the negative voltage −V gate, so including a Zener diode 308 in the negative side results in the required gate voltages +V gate and −V gate being reached almost immediately since the Zener diode 308 will shunt a large amount of current very quickly. The disadvantage is that the positive voltage +V gate is not as accurate and that any variation in the total supply voltage will appear as error in the positive voltage +V gate.

Figure 4A:
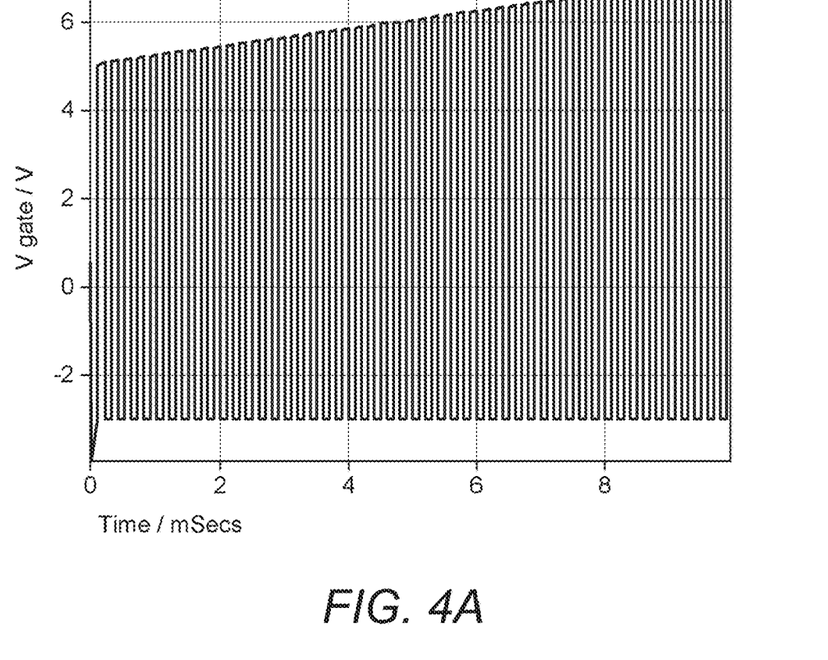
FIG. 4A is a graph showing the disadvantage of output circuitry such as that in FIG. 3A.

FIG. 4A is a graph showing this disadvantage of the output circuitry 300 of FIG. 3A. FIG. 4A is a graph of the output of the gate driver circuit 106 of FIG. 2, when using the output circuitry 300 of FIG. 3A in the gate drive system of FIG. 2. To produce this graph two 4.7 µF capacitors, a 1 kΩ resistor and a BZX84-3V0 Zener diode were used in the output circuitry 300. In FIG. 4A, as the total input voltage increases between 8 V and 10 V, the positive gate voltage increases as well. Therefore, any variation in the total supply will appear as error in the positive voltage +V gate.

On the contrary, the output circuitry 350 of FIG. 3B has the Zener diode 354 connected between the upper power rail 380 and the output return line 360. In the output circuitry 350, after start-up, the second capacitor 356 discharges through the resistor 358, which causes the voltage across second capacitor 356 to decrease, therefore increasing the voltage across the first capacitor 352. When the voltage across the first capacitor 352 becomes equal to the Zener breakdown voltage of the Zener diode 354, current is allowed through the Zener diode 354, and the circuit is balanced with the voltage +V gate clamped at the Zener breakdown voltage.

Including the Zener diode 354 in the positive side results in the positive voltage +V gate being the most accurate because the positive voltage +V gate is regulated by the Zener diode 354. Any variation in the total supply will appear as error in the negative voltage −V gate only. This is a particular advantage in GaN devices where accuracy of the positive voltage +V gate is essential. The disadvantage is that the resistor 358 shunts a low current, so it takes time to obtain the required gate voltages +V gate and −V gate.

Figure 4B:
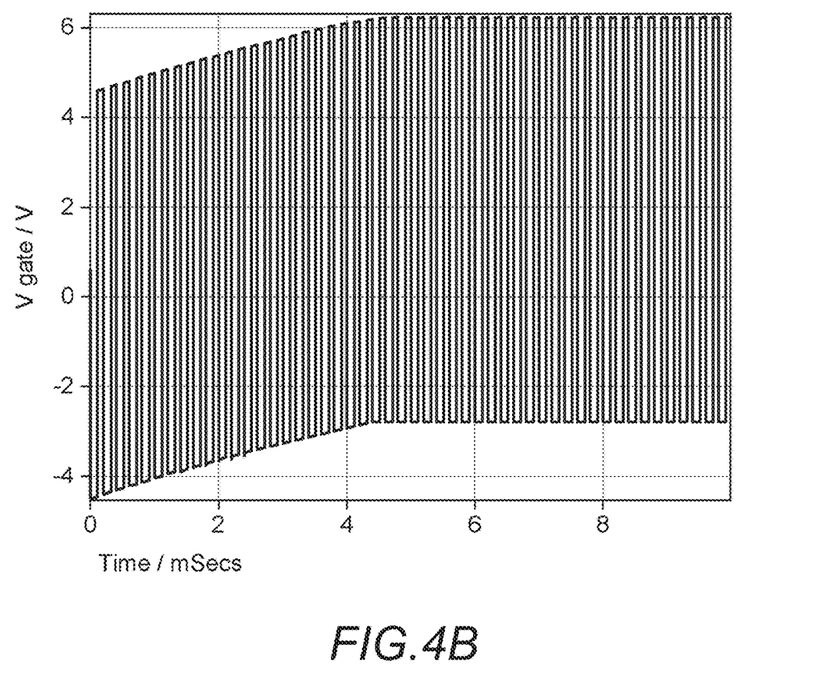
FIG. 4B is a graph showing the disadvantage of output circuitry such as that in FIG. 3B.

FIG. 4B demonstrates this disadvantage of the output circuitry of FIG. 3B. FIG. 4B is a graph of the output V gate of the gate driver circuit 106 of FIG. 2, when using the output circuitry 350 of FIG. 3B in the gate drive system of FIG. 2. To produce this graph two 4.7 µF capacitors, a 1 kΩ resistor and a BZX84-6V2 Zener diode were used in the output circuitry 350. In FIG. 4B, at start-up, it takes about 4.5 ms for the gate voltages +V gate and −V gate to reach their required values, in this case approximately +6.2 V and −2.8 V. Therefore, the output circuitry 350 of FIG. 3B takes a longer time to reach the required gate voltages than is desirable.

Previous attempts to overcome the disadvantages outlined above include supplying two individual isolated DC-DC converter outputs. This involves more windings in the transformers of the DC-DC converters and associated components, and so is more expensive. Another attempt to overcome the disadvantages outlined above includes using a more accurate regulated supply for the total output voltage. This again is more expensive. Another attempt to overcome the disadvantages outlined above forces the customer to supply a more accurate input supply to the input of an unregulated low-cost DC-DC converter, which passes the cost on to the customer and makes the component less attractive. Another attempt to overcome the disadvantages outlined above includes adding linear regulators to the input or output of the DC-DC converter. This adds extra cost and lowers the overall efficiency. Another attempt to overcome the disadvantages outlined above includes adding a delay in the application to allow time for the required gate voltages to be reached. This increases the start-up time of the customer's application.

The inventors of the present application discovered the desirability of providing output circuitry that combines the advantages of both approaches, providing an accurate positive voltage +V gate while also shunting a high current in the negative side so that the required voltages are reached very quickly.

SUMMARY OF THE INVENTION

To overcome the problems described above, preferred embodiments of the present invention provide power supply output devices that provide an accurate positive voltage +V gate. Any variation in the total supply will appear as error in the negative voltage −V gate only, which is a particular advantage in GaN devices where accuracy of the positive voltage +V gate is desirable. Furthermore, the power supply output devices allow shunting of a high current in the negative side so that the required gate voltages +V gate and −V gate are reached very quickly, which reduces the start-up time of the power switch gate drive system.

The above and other features, elements, characteristics, steps, and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention relate to a power supply output device. The power supply output device converts an input from a DC-DC converter into a bipolar voltage output of a gate driver circuit driving a power switch. The power output supply device includes a clamping circuit which sets the voltage values of the bipolar voltage output at a predetermined voltage through switching of one or more switching elements. The power supply output device allows shunting of a high current in the negative side so that the required bipolar voltage output is reached very rapidly.

First Preferred Embodiment of the Present Invention

Figure 5:
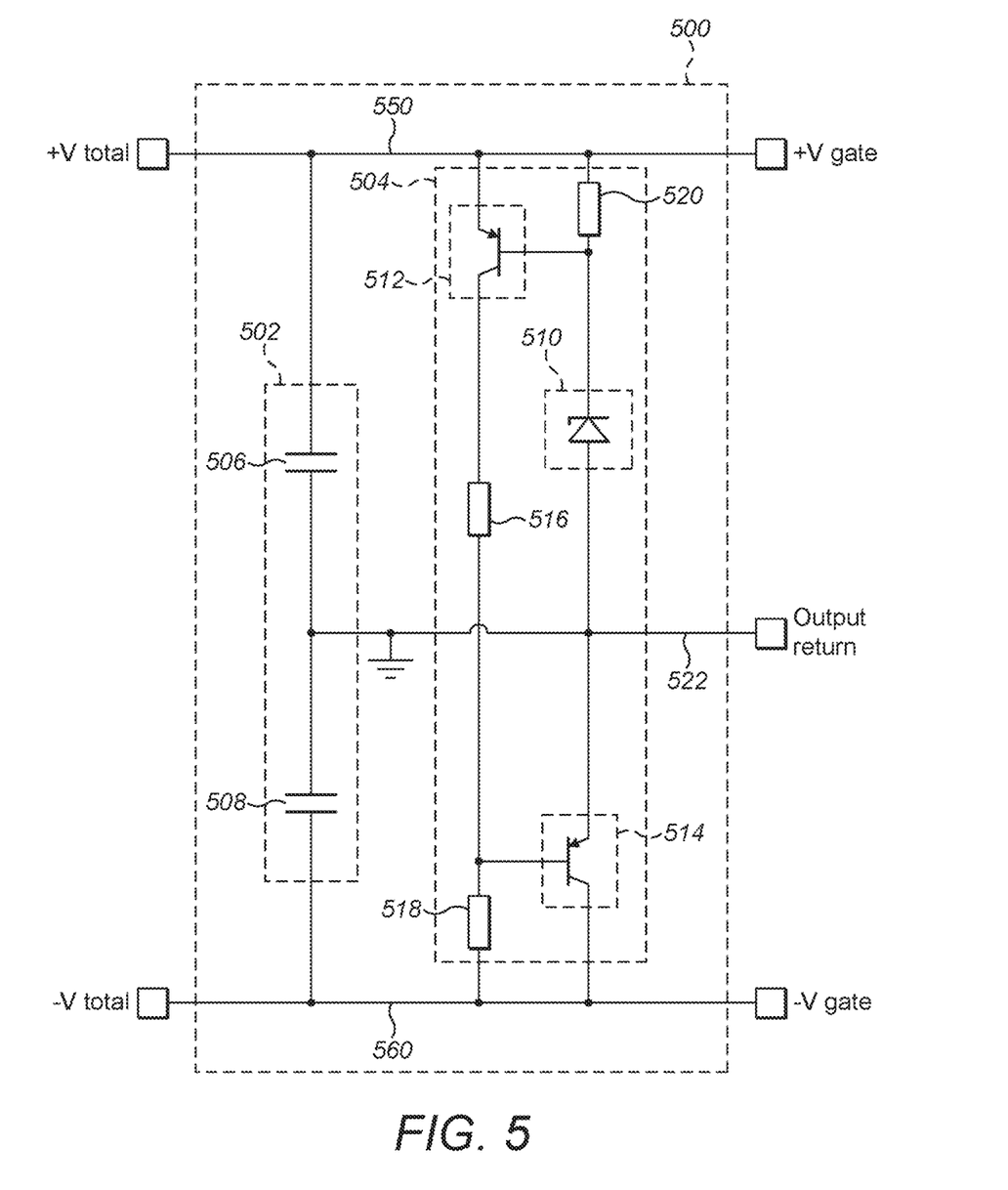
FIG. 5 shows a power supply output device of a first preferred embodiment of the present invention.

FIG. 5 shows a power supply output device 500 of a first preferred embodiment of the present invention. The power supply output device 500 of FIG. 5 includes a voltage dividing element 502 and a clamping circuit 504. The voltage dividing element 502 and the clamping circuit 504 are connected in parallel between an upper supply rail 550 and a lower supply rail 560. The upper supply rail 550 and lower supply rail 560 can be connected to the output of a DC-DC converter, such as the DC-DC converter 102 of FIG. 2.

The voltage dividing element 502 includes a first capacitor 506 and a second capacitor 508 in series, between the upper supply rail 550 and the lower supply rail 560. The first and second capacitors 506, 508 may have different capacitance values, or equal capacitance values. Preferably, the capacitance values of the first and second capacitor are equal for simplicity and cost reduction.

The clamping circuit 504 includes a voltage clamping element 510, a first switching element 512, a second switching element 514, a first resistor 516, a second resistor 518, and a third resistor 520. In the first preferred embodiment the voltage clamping element 510 is a Zener diode; however, a plurality of Zener diodes, a resistor, or a reference diode could be used as the voltage clamping element 510. In the first preferred embodiment each of the first switching element 512 and the second switching element 514 is a PNP transistor. However, the first and second switching elements 512, 514 may be other transistors, such as bipolar junction transistors or field effect transistors, for example MOSFETs or the like.

The clamping circuit 504 includes a first section in which the emitter of the first switching element 512 is connected to the upper power rail 550, the collector of the first switching element 512 is connected to the first resistor 516, the first resistor is connected in series with the second resistor 518, and the second resistor 518 is connected to the lower power rail 560.

The clamping circuit 504 includes a second section in which the collector of the second switching element 514 is connected to the lower power rail 560, the emitter of the second switching element 514 is connected to the voltage clamping element 510, the voltage clamping element is connected in series with the third resistor 520, and the third resistor 520 is connected to the upper power rail 550. If the voltage clamping element includes a Zener diode, then the Zener diode is oriented such that the cathode is connected to the third resistor 520.

The base of the first switching element 512 is connected to the second section between the voltage clamping element 510 and the third resistor 520. The base of the second switching element 514 is connected to the first section between the first resistor 516 and the second resistor 518.

The voltage dividing element 502 and the clamping circuit 504 are connected by an output return line 522. The output return line 522 is connected to ground. The output return line 522 is connected to the voltage dividing element 502 between the first capacitor 506 and the second capacitor 508, and is connected to the second section of the clamping circuit 504 between the voltage clamping element 510 and the second switching element 514.

The power supply output device 500 of FIG. 5 can be used as the output circuitry 104 in a system configured as in FIG. 2. A voltage is supplied from the DC-DC converter 102 between the upper supply rail 550 and the lower supply rail 560 of the power supply output device 500. The voltage supplies from the DC-DC converter 102 is an isolated voltage. The exact topology is not important. It could be a push pull, flyback, or forward converter, for example. The power supply output device 500 may be built into the DC-DC converter 102, or may be a separate entity. The voltage is supplied across the voltage dividing element 502.

The gate driver circuit 106 is connected across the clamping circuit 504 and uses the output of the power supply output device 500 to produce the signal V gate that is input into the gate terminal of the power switch 108. The source or emitter of the power switch 108 is connected to the output return line 522 via the output return line 110. If the power supply output device 500 is a built-in component of the DC-DC converter 102, the DC-DC converter includes a connection point of the output return line 110 to connect to the output return line 522, as well as two connection points of the gate driver circuit 106 to connect to the upper power rail 550 and the lower power rail 560.

At switch on, the voltage supplied by the DC-DC converter 102 appears across the voltage dividing element, +V total with respect to −V total in FIG. 5. The voltage dividing element 502 then divides the voltage between the first capacitor 506 and the second capacitor 508. If the first capacitor 506 and second capacitor 508 have equal capacitance, the voltage is initially split equally between them. For example, if a 9 V supply is used, the voltage drop across each of the capacitors would be 4.5 V.

Using a Zener diode as the voltage clamping element 510, the Zener diode and resistor 520 have a voltage drop across them equal to that across the first capacitor 506, which in this case is 4.5 V. The Zener breakdown voltage for the Zener diode is chosen above this voltage, and therefore, no current flows through the Zener diode. Thus, there is no current flowing through emitter base junction of the PNP transistor of the first switching element 512. Therefore, the first switching element 512 remains off.

In the second switching element 514, the PNP transistor is biased on by the second resistor 518, which is acting as a pull-down resistor. Therefore, the second switching element 514 quickly shunts current out of the second capacitor 508 and into the first capacitor 506. In other words, the second capacitor 508 discharges through the second switching element 514, causing the voltage across the second capacitor 508 to decrease and the voltage across the first capacitor 506 to increase.

When the voltage across the first capacitor 506 reaches a voltage equal to the voltage drop over both the voltage clamping element 510 and the base and emitter of the PNP transistor of the first switching element 512, the Zener diode of the voltage clamping element 510 starts to conduct current. For example, if the breakdown voltage of the Zener diode is 5.1 V and the voltage drop between the base and emitter of the PNP transistor of the first switching element 512 is 0.7 V, current starts to flow through the voltage clamping element 510 when the voltage over the first capacitor 506 reaches 5.8 V. The PNP transistor of the first switching element 512, therefore, switches on, as current can now flow between the emitter and base terminals. Thus, current passes through the first resistor 516 and the second resistor 518. The voltage across the second resistor 518, therefore, rises, and when the emitter base voltage of the PNP transistor of the second switching element 514 decreases to about 0.7 V, the second switching element 514 is forced to turn off. At this point, the circuit is balanced, with the voltage +V gate clamped at the same voltage as the voltage drop over the third resistor 520 and the voltage clamping element 510, approximately +6 V, and the voltage −V gate is approximately −3 V. The voltage values used here are exemplary and are not limiting.

The power supply output device 500 would operate in the same way if a reference diode was used as the voltage clamping element 510. A reference diode typically reaches its regulating voltage at a much lower current than a Zener diode.

If a resistor is used as the voltage clamping element 510, the voltage clamping element 510 and the third resistor 520 define a potential divider. After switch on, the second capacitor 508 discharges through the second switching element 514 as before. The first capacitor 506 could discharge through the resistor used as the voltage clamping element 510 and the third resistor 520, however the current through the second switching element 514 is larger. Thus, the second capacitor 508 discharges more rapidly, and therefore the first capacitor 506 charges up, which increases the voltage over the potential divider defined by the third resistor 520 and the voltage clamping element 510. The resistance values of the third resistor 520 and the voltage clamping element 510 are chosen so that the voltage of the midpoint of the potential divider switches on the first switching element 512 when the voltage +V gate reaches the desired voltage. For example, to clamp the voltage +V gate at +6 V, the resistance values are chosen such that the midpoint voltage reaches +5.3 V when the voltage +V gate reaches +6 V. At this point, the voltage drop between the base and emitter of the PNP transistor of the first switching element 512 is 0.7 V, and the first switching element switches on. As explained with the Zener diode example, this switches off the second switching element 514, and balances the circuit with the voltage +V gate clamped at the desired voltage. In order for the voltage +V gate to be accurate, the current flowing through the potential divider must be much greater than the base current of the first switching element 512.

The power supply output device 500 of the first preferred embodiment provides an accurate positive voltage +V gate while also shunting a high current in the negative side so that the required voltages are reached very quickly.

Figure 6A:
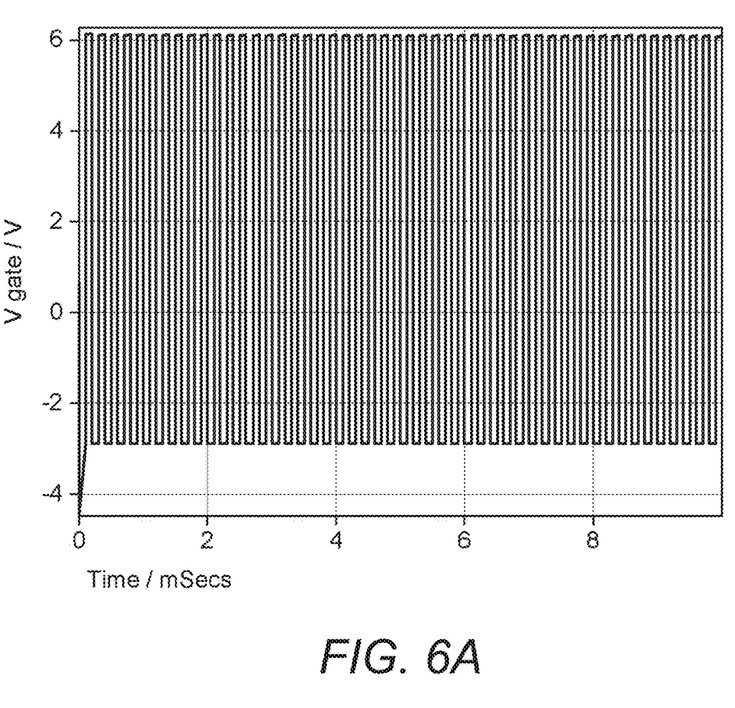
FIG. 6A is a graph showing an advantage of the power supply output device of the first preferred embodiment of the present invention.
Figure 6B:
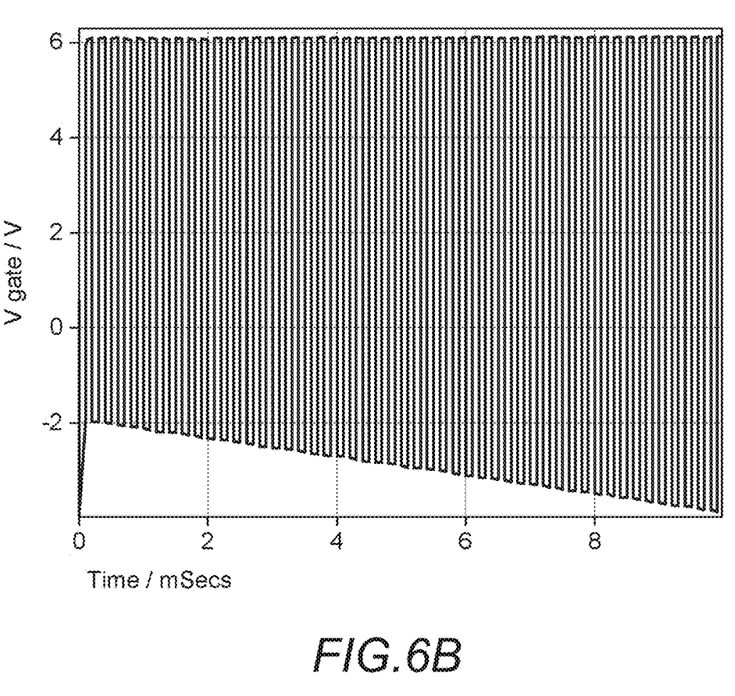
FIG. 6B is a graph showing an advantage of the power supply output device of the first preferred embodiment of the present invention.

FIGS. 6A and 6B are graphs demonstrating the advantages of the first preferred embodiment. These graphs show the voltage produced by the gate driver circuit 106 at the power switch 108, using the power supply output device 500 of FIG. 5 with a 9 V supply from the DC-DC converter, first and second capacitors 506, 508 with a 4.7 μF capacitance, a BZX84-5V1 Zener diode as the voltage clamping element 510, FMMTA63 PNP transistors for the first and second switching elements 512, 514, 10 kΩ resistors for the first and second resistors 516, 518, and a 1 kΩ resistor as the third resistor 520. Specific components and values given here are exemplary only. Various alternatives could be used, as would be understood by those skilled in the art.

FIG. 6A shows the operation of the system from start up. It can be seen that the gate drive system starts up almost immediately, within 100 μs, so that it does not suffer from the same disadvantage as the prior art in FIG. 4B.

Furthermore, it can be seen from FIG. 6B that as the total input supply voltage increases from 8 V to 10 V, the positive voltage stays constant and only the negative voltage changes. Therefore, a gate drive system using the power supply output device 500 of the first preferred embodiment does not suffer from the same disadvantage as the prior art in FIG. 4A.

This preferred embodiment could be applied to any power switch gate drive application, including but not limited to those in motor drives, inverters, uninterruptible power sources (UPS), solar power, electric vehicles and so on.

Although in this preferred embodiment the voltage clamping element 510 is connected on the positive side, so as to clamp the positive gate voltage +V gate, the voltage clamping element 510 could instead be connected on the negative side, if accurate control of the negative gate voltage −V gate was desired.

The examples of voltage values of the poles of the bipolar gate voltages herein are given with respect to the voltage of the output return line. The output return line is connected to the source or emitter of the power switch 308, and therefore the voltages +V gate and −V gate are given with respect to the voltage of the source or emitter of the power switch 308. The convention used herein is that the output return line is connected to ground and is at zero volts. However, the output return line does not have to be connected to ground, or at zero volts. Any other convention could be used.

Second Preferred Embodiment of the Present Invention

Figure 7:
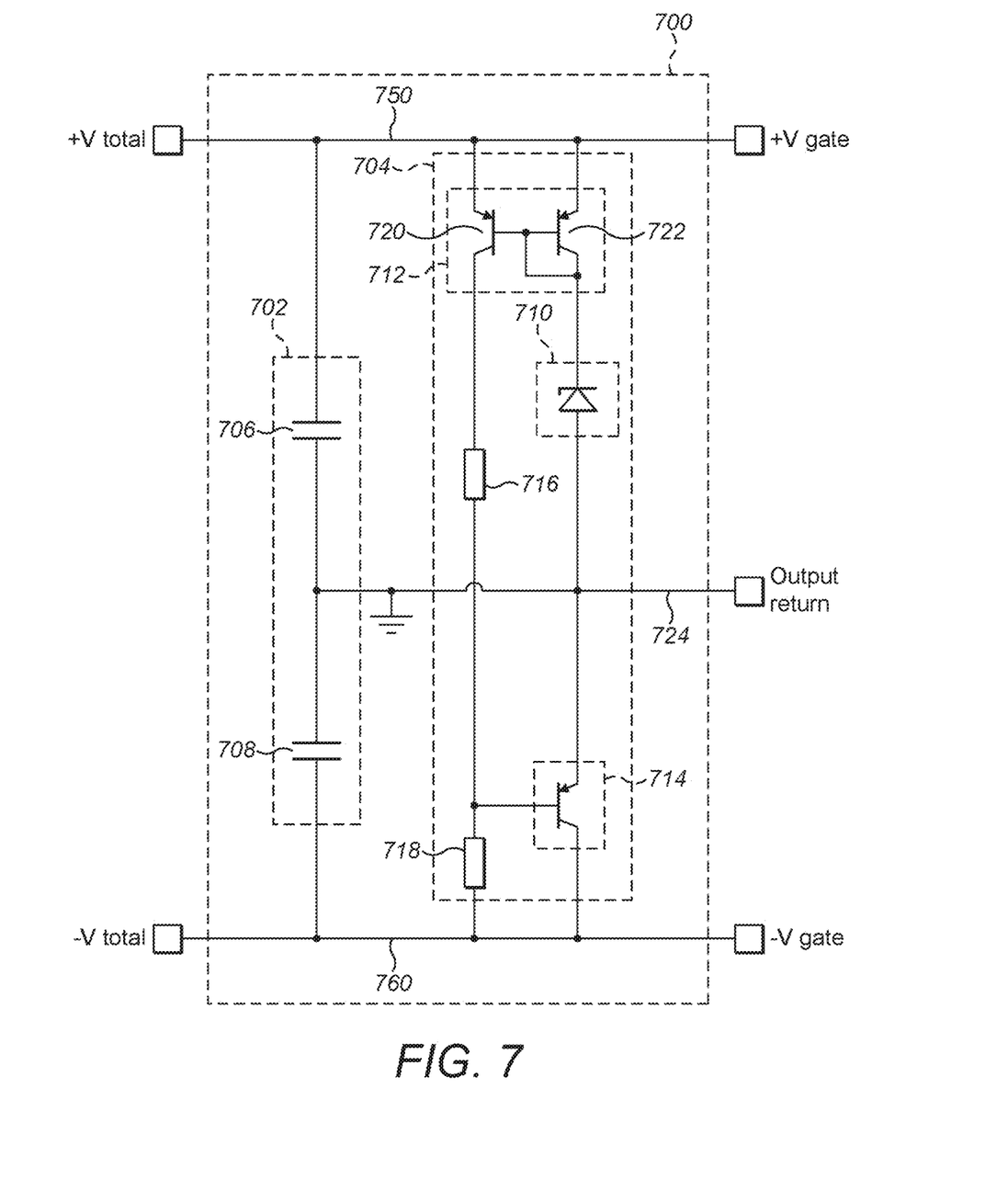
FIG. 7 shows a power supply output device of a second preferred embodiment of the present invention.

FIG. 7 shows a power supply output device 700 of the second preferred embodiment of the present invention. The power supply output device 700 of FIG. 7 includes a voltage dividing element 702 and a clamping circuit 704. The voltage dividing element 702 and the clamping circuit 704 are connected in parallel between an upper supply rail 750 and a lower supply rail 760. The upper supply rail 750 and lower supply rail 760 can be connected to the output of a DC-DC converter, such as the DC-DC converter 102 of FIG. 2.

The voltage dividing element 702 includes a first capacitor 706 and a second capacitor 708 in series, between the upper supply rail 750 and the lower supply rail 760. The first and second capacitors 706, 708 may have different capacitance values, or equal capacitance values. Preferably, the capacitance values of the first and second capacitor are equal for simplicity and cost reduction.

The clamping circuit 704 includes a voltage clamping element 710, a first switching element 712, a second switching element 714, a first resistor 716, and a second resistor 718. In the second preferred embodiment the voltage clamping element 710 is a Zener diode; however, a plurality of Zener diodes, a resistor, or a reference diode could be used as the voltage clamping element 710.

In the second preferred embodiment the first switching element 712 includes a current mirror. One example of a current mirror has been used for the second preferred embodiment; however, any configuration of current mirror can be used. The current mirror used as the first switching element 712 in the second preferred embodiment includes a first transistor 720 and a second transistor 722 connected via their base terminals. The base of the second transistor 722 is shorted to the collector of the second transistor 722. In the second preferred embodiment the transistors of the first switching element 712 are PNP transistors, and the second switching element 714 is a PNP transistor. However, the first and second switching elements 712, 714 may be other transistors, such as bipolar junction transistors or field effect transistors, for example MOSFETs or the like.

The clamping circuit 704 includes a first section in which the emitter of the first transistor 720 of the first switching element 712 is connected to the upper power rail 750, the collector of the first transistor 720 of the first switching element 712 is connected to the first resistor 716, the first resistor is connected in series with the second resistor 718 and the second resistor 718 is connected to the lower power rail 760.

The clamping circuit 704 includes a second section in which the collector of the second switching element 714 is connected to the lower power rail 760, the emitter of the second switching element 714 is connected to the voltage clamping element 710, the voltage clamping element is connected to the collector of the second transistor 722 of the first switching element 712, and the emitter of the second transistor 722 of the first switching element 712 is connected to the upper power rail 750. The base of the second switching element 714 is connected to the first section between the first resistor 716 and the second resistor 718. If the voltage clamping element includes a Zener diode, then the Zener diode is oriented such that the cathode is connected to the collector of the second transistor 722 of the first switching element 712.

The voltage dividing element 702 and the clamping circuit 704 are connected by an output return line 724. The output return line 724 is connected to ground. The output return line 724 is connected to the voltage dividing element 702 between the first capacitor 706 and the second capacitor 708, and is connected to the second section of the clamping circuit 704 between the voltage clamping element 710 and the second switching element 714.

The power supply output device 700 of FIG. 7 can be used as the output circuitry 104 in a system configured as in FIG. 2, in the same manner as the power output supply unit 500 of the first preferred embodiment.

At switch on, the voltage supplied by the DC-DC converter 102 appears across the voltage dividing element, +V total with respect to −V total in FIG. 7. The voltage dividing element 702 then divides the voltage between the first capacitor 706 and the second capacitor 708. If the first capacitor 706 and second capacitor 708 have equal capacitance, the voltage is initially split equally between them. For example, if a 9 V supply is used, the voltage drop across each of the capacitors would be 4.5 V.

Using a Zener diode as the voltage clamping element 710, the Zener diode has a voltage drop across it equal to that across the first capacitor 706, which in this case is 4.5 V. The Zener breakdown voltage for the Zener diode is chosen above this voltage, and therefore, no current flows through the Zener diode. Thus, there is no current flowing through the second transistor 722 of the first switching element 712.

The first and second transistors 720, 722 of the first switching element 712 define a current mirror. Thus, any current passing through the second transistor 722 is mirrored equally through the first transistor 720, regardless of the different voltages seen by each path. Therefore, when no current is flowing through the second transistor 722 of the first switching element 712, no current flows through the first transistor 720 of the first switching element 712. Thus, no current flows through the first resistor 716, and therefore the PNP transistor of the second switching element 714 is biased on by the second resistor 718, which is acting as a pull-down resistor. Therefore, the second switching element 714 quickly shunts current out of the second capacitor 708 and into the first capacitor 706. In other words, the second capacitor 708 discharges through the second switching element 714, causing the voltage across the second capacitor 708 to decrease and the voltage across the first capacitor 706 to increase.

When the voltage across the first capacitor 706 reaches a voltage equal to the voltage drop across both the voltage clamping element 710 and the base and emitter of the second transistor 722 of the first switching element 712, the Zener diode of the voltage clamping element 710 starts to conduct current. For example, if the breakdown voltage of the Zener diode is 5.1 V and the voltage drop between the base and emitter of the second transistor 722 of the first switching element 712 is 0.7 V, current would start to flow through the voltage clamping element 710 when the voltage over the first capacitor 706 reaches 5.8 V. The current flowing through the second transistor 722 of the first switching element 712 is mirrored in the current mirror, such that the current also flows down through the first resistor 716 and the second resistor 718. The voltage across the second resistor 718 therefore rises, and when the emitter base voltage of the PNP transistor of the second switching element 714 decreases to about 0.7 V then the second switching element 714 is forced to turn off. At this point, the circuit is balanced, with the voltage +V gate clamped at the same voltage as the voltage drop across both the emitter collector junction of the second transistor 722 and the voltage clamping element 710, approximately +6 V, and the voltage −V gate is approximately −3 V. The voltage values used here are exemplary and are not limiting.

The power supply output device 700 would operate in the same way if a reference diode was used as the voltage clamping element 710. A reference diode typically reaches its regulating voltage at a much lower current than a Zener diode.

The voltage clamping element 710 could be replaced with a resistor in the second preferred embodiment, if an additional resistor is connected between the base and the emitter of the second transistor 722. A potential divider would be defined by these two resistors, with the midpoint connected to the base terminals of the first and second transistors 720, 722. As described in the first preferred embodiment, as the second capacitor 708 discharges through the second switching element 714, the voltage +V gate increases. The resistors of the potential divider are chosen to switch the first transistor 722 on when the voltage +V gate reaches the required voltage. The current then starts flowing through the first transistor 722, which is mirrored in the current mirror of first switching element 712, therefore, switching the second switching element 714 off and balancing the circuit. In order for the voltage +V gate to be accurate, the current flowing through the potential divider must be much greater than the base current of the first and second transistors 720, 722.

An example of the components used in the second preferred embodiment to produce a positive gate voltage +V gate of +6 V from a 9 V supply from the DC-DC converter are first and second capacitors 706, 708 with a 4.7 µF capacitance, a BZX84-5V1 Zener diode as the voltage clamping element 710, FMMTA63 PNP transistors as the first and second transistors 720, 722 of the first switching element 712, a FMMTA63 PNP transistor as the second switching element 714, and 10 kΩ resistors for the first and second resistors 716, 718. Specific components and values are exemplary. Various alternatives could be used, as would be understood by those skilled in the art.

The advantages of the second preferred embodiment are the same as that of the first preferred embodiment, namely providing an accurate positive voltage +V gate while also shunting a high current in the negative side so that the required voltages are reached very quickly.

This preferred embodiment could be applied to any power switch gate drive application, including but not limited to those in motor drives, inverters, uninterruptible power sources (UPS), solar power, electric vehicles and so on.

Although in this preferred embodiment the voltage clamping element 710 is connected on the positive side, so as to clamp the positive gate voltage +V gate, the voltage clamping element 710 could instead be connected on the negative side, if accurate control of the negative gate voltage −V gate was desired.

The examples of voltage values of the poles of the bipolar gate voltages herein are given with respect to the voltage of the output return line. The output return line is connected to the source or emitter of the power switch 308, and therefore the voltages +V gate and −V gate are given with respect to the voltage of the source or emitter of the power switch 308. The convention used herein is that the output return line is connected to ground and is at zero volts. However, the output return line does not have to be connected to ground, or at zero volts. Any other convention could be used.

Third Preferred Embodiment of the Present Invention

Figure 8:
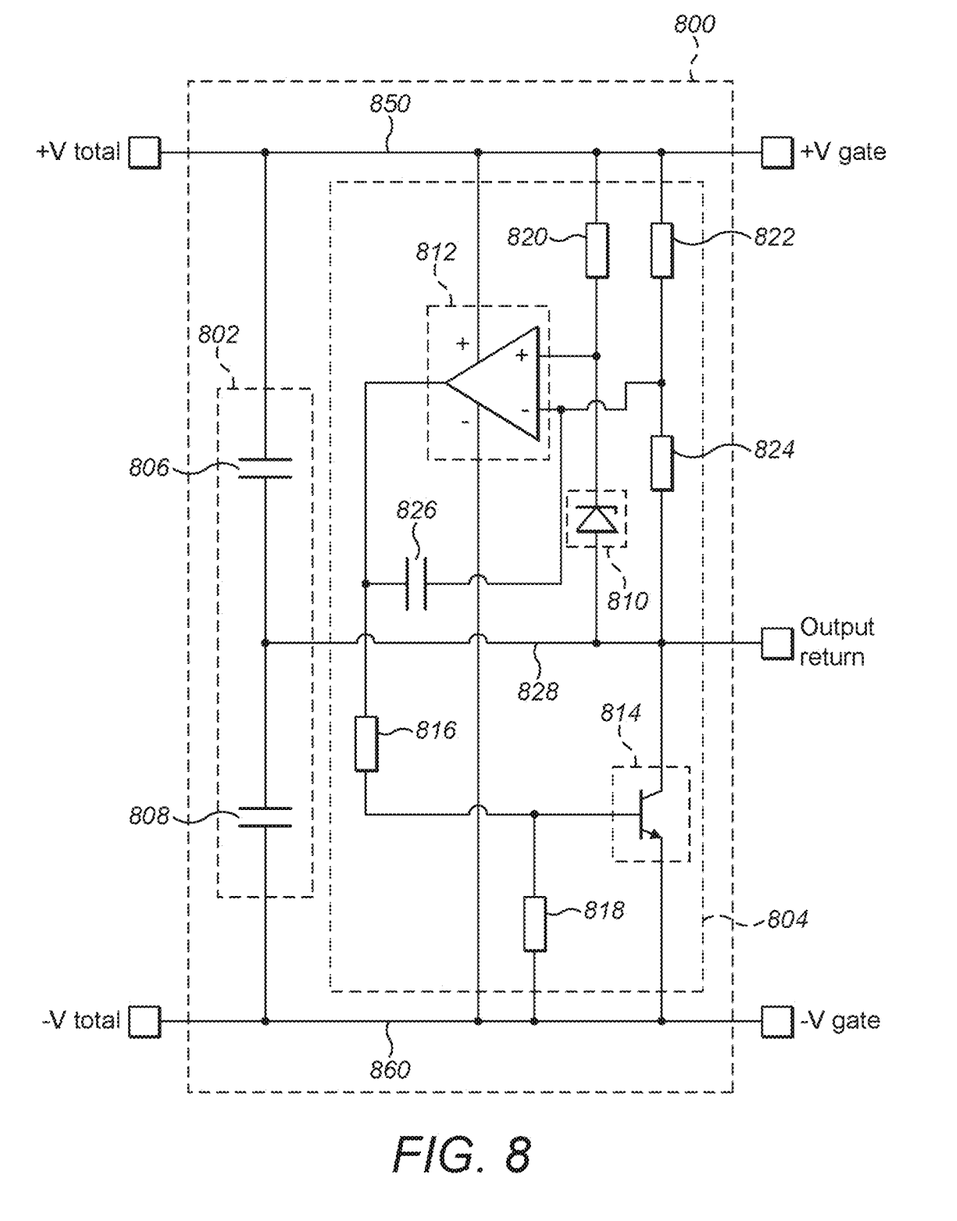
FIG. 8 shows a power supply output device of a third preferred embodiment of the present invention.

FIG. 8 shows a power supply output device 800 of a third preferred embodiment of the present invention. The power supply output device 800 of FIG. 8 includes a voltage dividing element 802 and a clamping circuit 804. The voltage dividing element 802 and the clamping circuit 804 are connected in parallel between an upper supply rail 850 and a lower supply rail 860. The upper supply rail 850 and lower supply rail 860 can be connected to the output of a DC-DC converter, such as the DC-DC converter 102 of FIG. 2.

The voltage dividing element 802 includes a first capacitor 806 and a second capacitor 808 in series, between the upper supply rail 850 and the lower supply rail 860. The first and second capacitors 806, 808 may have different capacitance values, or equal capacitance values. Preferably, the capacitance values of the first and second capacitor are equal for simplicity and cost reduction.

The clamping circuit 804 includes a voltage clamping element 810, a first switching element 812, a second switching element 814, a first resistor 816, a second resistor 818, a third resistor 820, a fourth resistor 822, a fifth resistor 824, and a third capacitor 826. In the third preferred embodiment, the voltage clamping element 810 includes a Zener diode; however, a plurality of Zener diodes or a reference diode could be used as the voltage clamping element 810. In the third preferred embodiment, the first switching element 812 is an operational amplifier (op amp). In the third preferred embodiment, the second switching element 814 is a NPN transistor; however, the second switching element 814 may be another transistor, such as a bipolar junction transistor or a field effect transistor, for example a MOSFET or the like.

The clamping circuit 804 includes a first section in which the third resistor 820 is connected between the upper power rail 850 and the non-inverting input of the op amp of the first switching element 812, and the voltage clamping element 810 is connected between the non-inverting input of the op amp and an output return line 828. If the voltage clamping element 810 is a Zener diode, then the Zener diode is oriented such that the anode is connected to the output return line 828.

The clamping circuit 804 includes a second section in which the output of the op amp of the first switching element 812 is connected to the first resistor 816, the first resistor is connected in series to the second resistor 818, and the second resistor 818 is connected to the lower power rail 860. The inverting input of the op amp of the first switching element 812 is connected to the output of the op amp of the first switching element 812 via the third capacitor 826.

The clamping circuit 804 includes a third section in which the emitter of the second switching element 814 is connected to the lower power rail 860, the collector of the second switching element 814 is connected to the fifth resistor 824, the fifth resistor 824 is connected in series with the fourth resistor 822, and the fourth resistor 822 is connected to the upper power rail 850.

The base of the second switching element 814 is connected to the second section of the clamping circuit 804 between the first resistor 816 and the second resistor 818. The inverting terminal of the op amp of the first switching element 812 is connected to the third section between the fourth resistor 822 and the fifth resistor 824.

The voltage dividing element 802 and the clamping circuit 804 are connected by an output return line 828. The output return line 828 is connected to ground. The output return line 828 is connected to the voltage dividing element 802 between the first capacitor 806 and the second capacitor 808, and is connected to the third section of the clamping circuit 804 between the collector of the second switching element 814 and the fifth resistor 824. The output return line 828 is also connected to the voltage clamping element 810 as described previously.

The upper power rail 850 is connected to the positive power supply of the op amp of the first switching element 812, and the negative power rail 860 is connected to the negative power supply of the op amp.

The power supply output device 800 of FIG. 8 can be used as the output circuitry 104 in a system configured as in FIG. 2, in the same manner as the power output supply units 500, 700 of the first and second preferred embodiments.

At switch on, the voltage supplied by the DC-DC converter 102 appears across the voltage dividing element, +V total with respect to −V total in FIG. 8. The voltage dividing element 802 then divides the voltage between the first capacitor 806 and the second capacitor 808. If the first capacitor 806 and second capacitor 808 have equal capacitance, the voltage is initially split equally between them. For example, if a 9 V supply is used, the voltage drop across each of the capacitors would be 4.5 V.

The op amp of the first switching element 812 acts as a voltage comparator. When the non-inverting input has a higher voltage that the inverting input, the op amp of the first switching element 812 outputs a positive voltage. When the non-inverting input has a lower voltage that the inverting input, the op amp of the first switching element 812 outputs a negative voltage. When the op amp of the first switching element 812 outputs a positive voltage, the second switching element 814 will be switched on. When the op amp outputs a negative voltage, the second switching element 814 will be switched off. The third capacitor 826 provides negative feedback, to prevent any input noise causing rapid fluctuations in the output of the op amp of the first switching element 812.

The fourth and fifth resistor 822, 824 form a potential divider. The fourth and fifth resistor 822, 824 can have different resistance values, or may have the same resistance value. If the fourth and the fifth resistor 822, 824 have the same resistance value, at switch on, a quarter of the initial supply voltage is input into the inverting input of the op amp of the first switching element 812, in this case 2.25 V. The Zener diode of the voltage clamping element 810 is chosen so that it is above its breakdown voltage at start up. The voltage input into the non-inverting input of the first switching element 812 is, therefore, held at the Zener breakdown voltage of the Zener diode, for example 3 V. In this case, at start up, the non-inverting input is at a higher voltage than the inverting input, and therefore, the op amp of the first switching element 812 has a positive output, so the second switching element 814 is switched on.

The second capacitor 808, therefore, discharges through the second switching element 814, causing the voltage across the first capacitor 806 to increase. The first capacitor 806 could discharge through the fourth and fifth resistors 822, 824; however, the current through the second switching element 814 is larger than the current through the fourth and fifth resistors 822, 824. Thus, the second capacitor 808 discharges more rapidly, and therefore the first capacitor 806 charges up.

The circuit is configured by selecting the Zener breakdown voltage and the resistance values of the fourth and fifth resistors 822, 824 so that at the point when the positive gate voltage +V gate reaches the desired value, the inverting input of the op amp of the first switching element 812 becomes larger than the non-inverting input of the op amp of the first switching element 812, in order to switch off the second switching element 814. In this example, when the positive gate voltage +V gate reaches +6 V, the inverting input of the op amp of the first switching element 812 reaches +3 V, and the output of the op amp the first switching element 812 becomes negative and, therefore, switches the second switching element 814 off. At this point, the circuit is balanced, with the voltage +V gate clamped at the desired voltage, approximately +6 V, and the voltage −V gate is approximately −3 V. The voltage values used here are exemplary and are not limiting.

The power supply output device 800 would operate in the same way if a reference diode was used as the voltage clamping element 810. A reference diode typically reaches its regulating voltage at a much lower current than a Zener diode.

An example of the components used for the third preferred embodiment to produce a positive gate voltage +V gate of +6 V from a 9 V supply from the DC-DC converter are first and second capacitors 806, 808 with a 4.7 μF capacitance, a BZX84-3V0 Zener diode as the voltage clamping element 810, an LM324 operational amplifier as the first switching element 812, a FMMTA43 NPN transistor as the second switching element 814, a 10 kΩ first resistor 816, a 1 kΩ second resistor 818, a 3 kΩ third resistor 820, a 10 kΩ fourth resistor 822, a 10 kΩ fifth resistor 824, and a 10 nF third capacitor 826. Specific components and values given here are exemplary only. Various alternatives could be used, as would be understood by those skilled in the art.

The advantages of the third preferred embodiment are the same as that of the first and second preferred embodiments, namely providing an accurate positive voltage +V gate while also shunting a high current in the negative side so that the required voltages are reached very quickly.

This preferred embodiment could be applied to any power switch gate drive application, including but not limited to those in motor drives, inverters, uninterruptible power sources (UPS), solar power, electric vehicles and so on.

Although in this preferred embodiment the voltage clamping element 810 is connected on the positive side, so as to clamp the positive gate voltage +V gate, the voltage clamping element 810 could instead be connected on the negative side, if accurate control of the negative gate voltage −V gate was desired.

The examples of voltage values of the poles of the bipolar gate voltages herein are given with respect to the voltage of the output return line. The output return line is connected to the source or emitter of the power switch 308, and therefore the voltages +V gate and −V gate are given with respect to the voltage of the source or emitter of the power switch 308. The convention used herein is that the output return line is connected to ground and is at zero volts. However, the output return line does not have to be connected to ground, or at zero volts. Any other convention could be used.

The preferred embodiments of the present invention described above are not limited to power supplies for IGBT, SIC, MOS, and GaN power switches and may readily be used in other power switching technologies.

Examples physical values, including voltages, resistances, capacitances, breakdown voltages and the like, as well as examples of specific model numbers of components given throughout the preferred embodiments are exemplary only. Various alternatives could be used, as would be understood by those skilled in the art.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

The invention claimed is:

1. A power supply output device for a DC-DC converter configured to provide a supply voltage, the power supply output device comprising:
   a supply input to receive the supply voltage from the DC-DC converter;
   a voltage dividing element to convert the supply voltage into a bipolar voltage output to be supplied to a gate driver circuit and includes first and second output voltage values;
   an output to supply the bipolar voltage output to a gate driver circuit; and
   a clamping circuit including a voltage clamping element and one or more switching elements to set one of the first or the second output voltage values of the bipolar voltage output at a predetermined voltage through switching of the one or more switching elements, the predetermined voltage being set by the voltage clamping element.

2. The power supply output device of claim 1, wherein the device includes an output return input to receive a feedback voltage signal from a switch driven by the gate driver circuit.

3. The power supply output device of claim 2, wherein the output return input is connected to an intermediate point of the voltage dividing element.

4. The power supply output device of claim 3, wherein the output return input is connected to the clamping circuit.

5. The power supply output device of claim 2, wherein the output return input is connected to a ground.

6. The power supply output device of claim 2, wherein the supply input and the output include an upper supply rail and a lower supply rail, between which the voltage dividing element and the clamping circuit are connected.

7. The power supply output device of claim 6, wherein the clamping circuit includes a first switching element and a second switching element.

8. The power supply output device of claim 7, wherein the first switching element is configured to switch off the second switching element when the one of the first or the second output voltage values of the bipolar voltage output reaches the predetermined voltage.

9. The power supply output device of claim 7, wherein the clamping circuit is configured to clamp the one of the first or the second output voltage values of the bipolar voltage output at the predetermined voltage when the second switching element is switched off.

10. The power supply output device of claim 7, wherein the first switching element is configured to switch on when the one of the first or second output voltage values of the bipolar voltage output reaches the predetermined voltage.

11. The power supply output device of claim 10, wherein the first switching element is configured to switch off the second switching element when the first switching element switches on.

12. The power supply output device of claim 7, wherein at least one of the first and the second switching elements includes a transistor.

13. The power supply output device of claim 7, wherein the clamping circuit includes:
a first section including the first switching element, a first resistor, and a second resistor connected in series between the upper supply rail and the lower supply rail; and
a second section including a third resistor, the voltage clamping element, and the second switching element connected in series between the upper supply rail and the lower supply rail; wherein
the first switching element is connected between the third resistor and the voltage clamping element; and
the second switching element is connected between the first resistor and the second resistor.

14. The power supply output device of claim 7, wherein the first switching element includes an operational amplifier.

15. The power supply output device of claim 14, wherein the clamping circuit includes:
a first section including the first switching element, a first resistor, the clamping element, a first capacitor, a second resistor, and a third resistor; and
a second section including a fourth resistor, a fifth resistor, and the second switching element connected in series between the upper supply rail and the lower supply rail; wherein
the first resistor is connected between the upper supply rail and a non-inverting input of the first switching element,
the clamping element is connected between the non-inverting input of the first switching element and the output return input,
the first capacitor is connected between an inverting input of the first switching element and an output of the first switching element,
the second and third resistors are connected in series between the output of the first switching element and the lower supply rail,
the inverting input of the first switching element is connected between the fourth resistor and the fifth resistor; and
the second switching element is connected between the second resistor and the third resistor.

16. The power supply output device of claim 7, wherein at least one of the first and second switching elements includes a current mirror.

17. The power supply output device of claim 16, wherein the clamping circuit includes:
a first section including the first switching element, a first resistor, and a second resistor connected in series between the upper supply rail and the lower supply rail; and
a second section including the voltage clamping element and the second switching element connected in series between the first switching element and the lower supply rail; wherein
the first switching element includes a current mirror; and
the second switching element is connected between the first resistor and the second resistor.

18. The power supply output device of claim 1, wherein the predetermined voltage is set by the voltage clamping element and a resistor in series with the voltage clamping element.

19. The power supply output device of claim 1, wherein the voltage clamping element includes a Zener diode.

20. The power supply output device of claim 19, wherein the predetermined voltage is determined in part by a breakdown voltage of the Zener diode.

21. The power supply output device of claim 1, wherein the voltage clamping element includes a reference diode.

22. The power supply output device of claim 1, wherein the voltage clamping element includes a resistor.

23. The power supply output device of claim 1, wherein the voltage dividing element includes a first capacitor and a second capacitor connected in series.

24. A DC-DC converter including the power supply output device of claim 1.

25. A power switch gate drive system comprising:
a DC-DC converter;
a gate driver circuit;
a switch configured to receive an output of the gate driver circuit; and
the power supply output device of claim 1.

* * * * *